(12) United States Patent
Garuti et al.

(10) Patent No.: US 7,485,827 B2
(45) Date of Patent: Feb. 3, 2009

(54) PLASMA GENERATOR

(75) Inventors: Marco Garuti, Reggio Emilia (IT); Cristina Leonelli, Modena (IT); Paolo Veronesi, Modena (IT)

(73) Assignee: Alter S.R.L., Reggio Emilia (IT)

( * ) Notice: Subject to any disclaimer, the term of this patent is extended or adjusted under 35 U.S.C. 154(b) by 112 days.

(21) Appl. No.: 11/490,555

(22) Filed: Jul. 21, 2006

(65) Prior Publication Data

US 2008/0029493 A1    Feb. 7, 2008

(51) Int. Cl.
*B23K 10/00* (2006.01)

(52) U.S. Cl. .................... 219/121.43; 219/121.41; 118/723 MW; 204/298.38

(58) Field of Classification Search ............. 219/121.4, 219/121.41, 121.43, 121.44; 118/723 MW; 204/298.27, 298.38
See application file for complete search history.

(56) References Cited

U.S. PATENT DOCUMENTS

| | | | |
|---|---|---|---|
| 4,776,918 A | 10/1988 | Otsubo et al. | |
| 5,134,965 A | 8/1992 | Tokuda et al. | |
| 5,302,803 A | 4/1994 | Stevens et al. | |
| 5,359,177 A | 10/1994 | Taki et al. | |
| 5,529,669 A * | 6/1996 | Koch et al. | 204/157.43 |
| 5,558,717 A | 9/1996 | Zhao et al. | |
| 5,853,607 A | 12/1998 | Zhao et al. | |
| 5,885,356 A | 3/1999 | Zhao et al. | |
| 5,954,882 A | 9/1999 | Wild et al. | |
| 2003/0077883 A1 | 4/2003 | Ohtake | |
| 2005/0005854 A1 | 1/2005 | Suzuki | |

FOREIGN PATENT DOCUMENTS

| | | |
|---|---|---|
| EP | 0382065 | 8/1990 |
| GB | 2364434 | 1/2002 |
| JP | 62211375 | 9/1987 |
| JP | 5239655 | 9/1993 |
| JP | 6005386 | 1/1994 |
| JP | 6120155 | 4/1994 |
| JP | 6216040 | 8/1994 |
| JP | 8330097 | 12/1996 |
| JP | 2000277296 | 10/2000 |
| JP | 2002158216 | 5/2002 |
| JP | 2002355550 | 12/2002 |
| JP | 2005019968 | 1/2005 |
| WO | WO 92/22085 | 12/1992 |
| WO | WO 99/12184 | 3/1999 |
| WO | WO 2004/012251 | 2/2004 |

* cited by examiner

*Primary Examiner*—Mark H Paschall
(74) *Attorney, Agent, or Firm*—Pearne & Gordon LLP

(57) ABSTRACT

A plasma generator comprising a propagation chamber propagating an electromagnetic radiation, and a plasma-generating chamber associated with the propagation chamber; said propagation chamber has a passage region of increasing width on moving away from the entrance region for insertion of the electromagnetic radiation into the propagation chamber. The passage region enables an at least partial passage of the electromagnetic radiation towards the plasma-generating chamber.

15 Claims, 3 Drawing Sheets

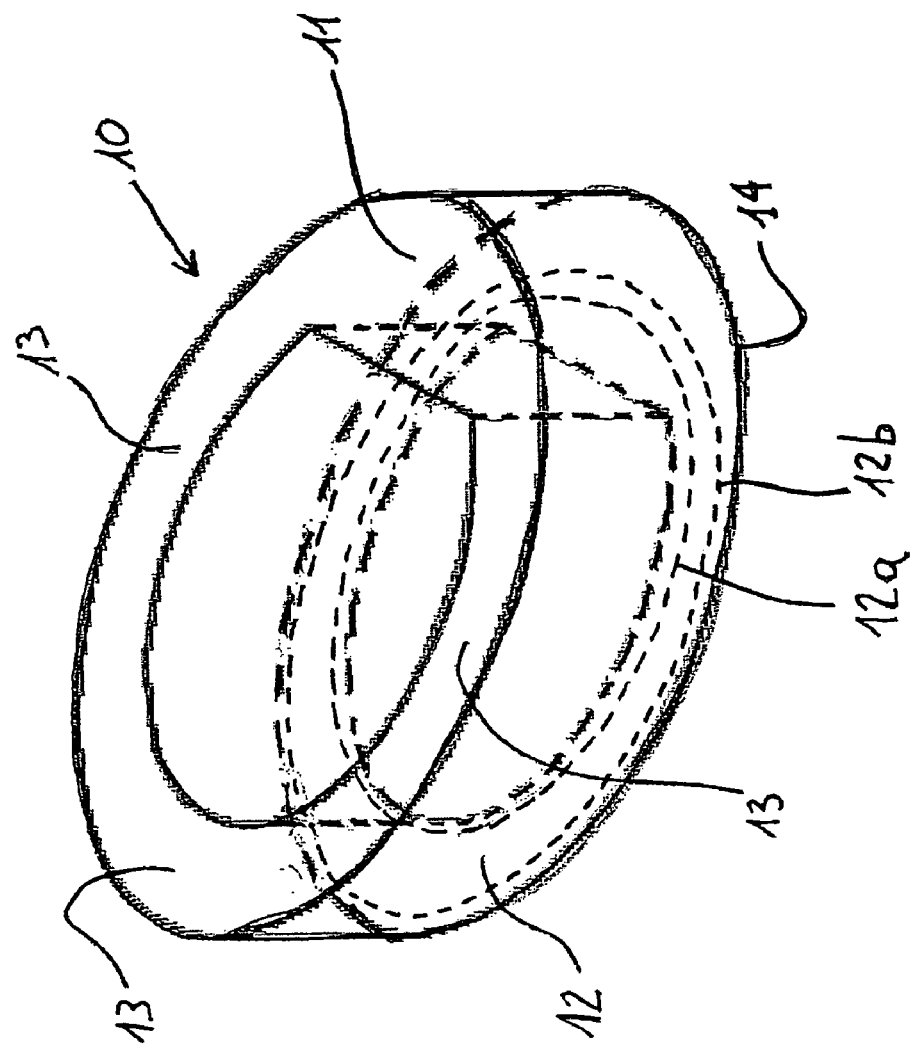

PLASMA GENERATOR

FIELD AND BACKGROUND OF THE INVENTION

The present invention relates to a plasma generator.

It is known that surface working operations of objects and materials (such as silicon wafers, metal items, etc.) can be performed through use of plasma, i.e. a gas on which striking of a suitable electromagnetic radiation has been caused, so as to ionise the gas itself; said plasma is generally referred to as "ionised gas".

The radiation used can be a radiofrequency (RF) radiation or microwaves.

The gas to be ionised and the electromagnetic radiation are caused to interact within a suitably insulated chamber, in which microwaves are introduced by means of a waveguide; for passage from the waveguide to the plasma generating chamber the waveguide itself is provided with one or more openings.

In more detail, a waveguide enables propagation of the microwaves from a generator to a propagation chamber, in which the microwaves propagate following a typically circular path.

Said openings are generally formed in the lower surface (or base surface) of the propagation chamber, at such a path.

The plasma generating chamber is separated from the propagation chamber exactly by the lower surface of said propagation chamber.

The openings in the propagation chamber are usually identical with each other and can have several different shapes and arrangements. For instance, the European Patent EP0880164 discloses slots of elongated shape substantially identical with each other and disposed in radial directions on the separation plate between the waveguide and the plasma generating chamber.

However, it is to be pointed out that microwaves reduce their intensity as they move away from their source (i.e. the generator connected upstream of the waveguide), and in particular they reduce their intensity as they propagate from the waveguide outlet to the inside of the propagation chamber.

Therefore, the microwave ionisation capability progressively decreases as the microwaves move away from the intersection between the waveguide and the propagation chamber.

On the contrary, the gas to be ionised is usually distributed in a uniform manner within the plasma generating chamber; this involves a non homogeneous distribution of the plasma obtained by intersection between the microwaves and the gas present in the plasma generating chamber.

In fact, at the waveguide outlet a greater amount of plasma will be obtained (because the microwave intensity is greater), while at the farthest point (diametrically opposite, in the event of a cylindrical structure) the ionised-gas amount will be much smaller, due to the lower intensity of the microwaves.

As a result, plasma distribution in the generating chamber will be non uniform, which will clearly adversely affect the quality of the surface treatment to be carried out with the plasma thus obtained.

SUMMARY OF THE INVENTION

Accordingly, it is an aim of the present invention to provide a plasma generator that is able to generate a spatially homogeneous plasma cloud.

Another aim of the present invention is to make available a plasma generator with a reduced bulkiness without the amount and quality of the ionised gas generated thereby being reduced.

The foregoing and further aims are substantially achieved by a plasma generator having the features recited in the appended claims.

BRIEF DESCRIPTION OF THE DRAWINGS

Further features and advantages will become more apparent from the detailed description of a preferred but not exclusive embodiment of a plasma generator in accordance with the invention.

This description will be taken hereinafter with reference to the accompanying drawings given by way of non-limiting example, in which:

FIG. 5 is a diagrammatic perspective view of a detail of the generator in FIG. 1.

DESCRIPTION OF THE PREFERRED EMBODIMENT

Figure 1:
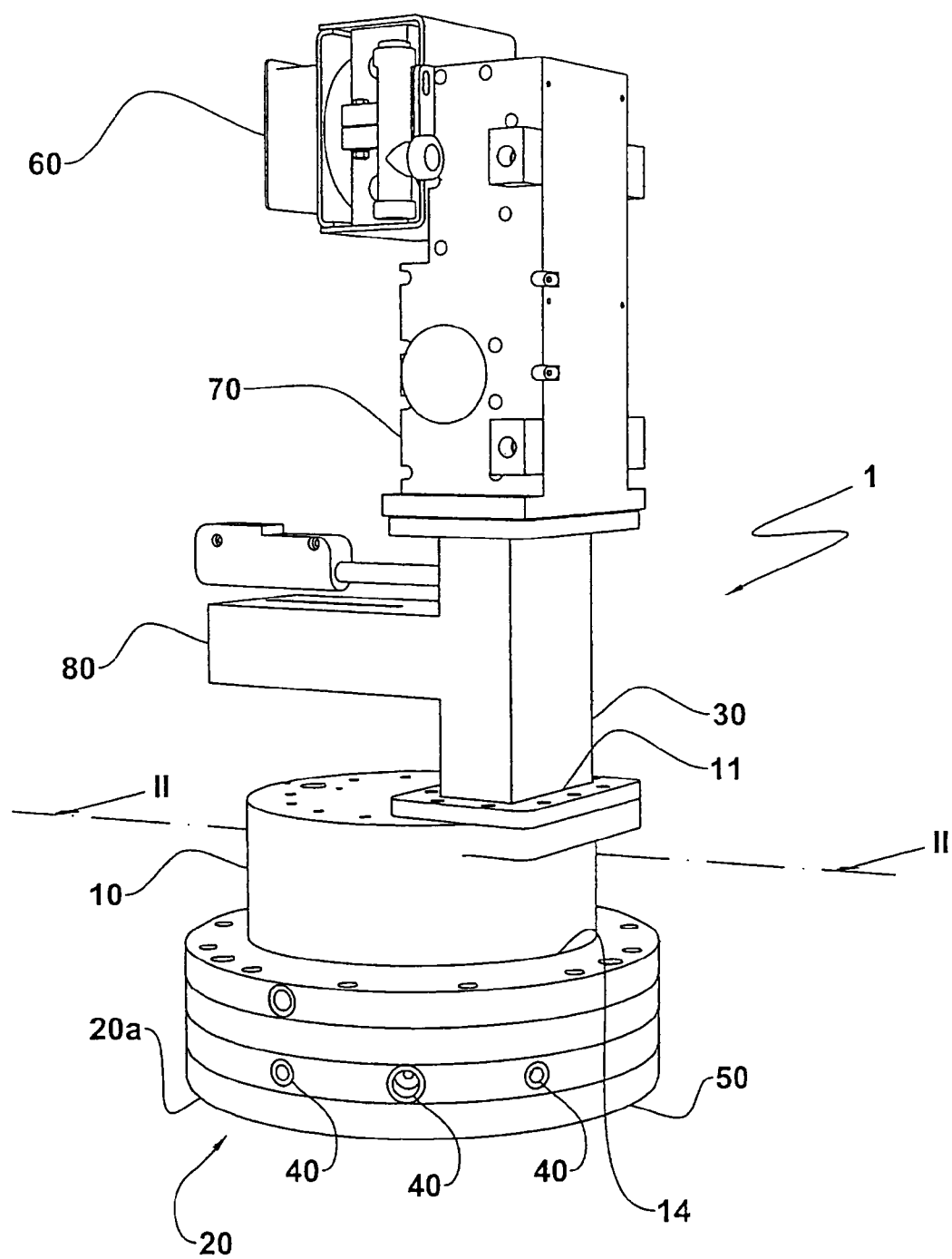
FIG. 1 is a diagrammatic perspective view of a plasma generator in accordance with the invention.

With reference to the drawings, a plasma generator in accordance with the invention has been generally denoted at 1.

Generator 1 (FIG. 1) comprises a device 60 to generate an electromagnetic radiation of a predetermined frequency.

This electromagnetic radiation preferably has a frequency included in the microwave range; in particular said frequency can be of 2450 MHz.

The device 60 is associated with a high-voltage switching feeder, set to generate pulses having frequencies up to a maximum (impulse) power of 10 kHz and a 8 kW.

Generator 1 further comprises a launcher with a circulator 70. The launcher has the function of conveying the electromagnetic waves emitted from the generator antenna into the waveguide. The circulator enables dissipation on a passive water load of the microwave energy, should said energy be reflected towards the generator due to an impedance mismatch, thus protecting the generator itself.

Generator 1 further comprises a waveguide 30 to guide propagation of said electromagnetic radiation, and regulation means 80 associated with the waveguide 30 to regulate the electromagnetic field defined by the electromagnetic radiation and maximise the energy thereof at the interaction region with the gas to be ionised, as better clarified in the following.

Practically the regulation means 80 can comprise a power-driven variable short-circuit.

Generator 1 further comprises a propagation chamber 10 within which the electromagnetic radiation is caused to propagate.

Preferably, the propagation chamber 10 has a substantially cylindrical conformation and in particular the axial-extension direction of the propagation chamber 10 can be substantially parallel to the major extension direction of the waveguide 30.

The waveguide 30 has a tubular conformation and can have a rectangular transverse section. The waveguide 30 preferably operates either in the fundamental TE01 mode, or in upper modes.

Under use conditions, generator 1 is such positioned that the major extension direction of the waveguide 30 and axial-extension direction of the propagation chamber 10 are substantially parallel, being vertical or horizontal to the ground.

Launcher 70 is preferably connected to an upper end of the waveguide 40 and the device 60 is mounted over said launcher 70.

In more detail, the electromagnetic radiation is inserted at an entrance region 11 of the propagation chamber 10. Preferably, the entrance region 11 is defined in a perimetral position of the propagation chamber 10; in other words, the entrance region 11 is positioned at a predetermined non-zero radial distance from the centre (i.e. the longitudinal axis) of the propagation chamber 10, the latter having a substantially cylindrical conformation with a circular section, as above said.

As shown in FIG. 1, the entrance region 11 is defined at the junction between the waveguide 30 and the propagation chamber 10.

The regulation means 80 extends in a radial direction from the waveguide 30; in particular, when the waveguide 30 is arranged in a vertical direction, the regulation means 80 extends in a substantially horizontal direction.

In still more detail, the junction between the waveguide 30 and the propagation chamber 10 (i.e. the entrance region 11) is out of centre relative to the centre of the propagation chamber 10 itself, and the regulation means 80 extends along a direction defined by the straight line joining the entrance region 11 and the centre of the upper base of the propagation chamber 10, in a direction from the entrance region 11 to the centre of the propagation chamber 10. In this manner, the overall side dimensions of device 1 can be restricted.

Propagation of the electromagnetic radiation within the propagation chamber 10 takes place along a path 13 defined within the propagation chamber 10 itself (FIGS. 2-5).

This path 13 can be a continuous and closed path; path 13 preferably has an annular conformation and may be of rectangular cross section, for example.

In the preferred embodiment, path 13 extends along a perimetral area of the propagation chamber 10.

Advantageously, said waveguide 30 allows insertion of the electromagnetic radiation in a transverse direction and preferably a direction perpendicular to the equatorial plane of path 13; by equatorial plane of path 13 in the present context and in the following claims it is intended a plane perpendicular to the longitudinal axis of the annular structure of the path 13 itself.

The electromagnetic radiation inserted into the annular structure present in the propagation chamber 10 by the T-shaped junction between the waveguide 30 and path 13 goes on into the two symmetric branches defining said path 13, so as to form a stationary wave configuration depending on the geometry of the structure and the load (i.e. the gas to be ionised) present in the generating chamber to be described in the following.

Generator 1 further comprises a plasma generating chamber 20 associated with said propagation chamber 10; when generator 1 is in a use condition, the generating chamber 20 is preferably mounted under the propagation chamber 10.

In the generating chamber 20 the electromagnetic radiation interacts with a gas to be ionised, so that a plasma is generated.

To this aim, the propagation chamber 10 has a passage region 12 extending along path 13 and enabling passage of the electromagnetic radiation from the propagation chamber 10 to the generating chamber 20.

The passage region 12 can be continuous along path 13, so that the electromagnetic radiation can pass from the propagation chamber 10 to the generating chamber 20 in spatial continuity, without hindrances or breaks.

Preferably the passage region 12 has an annular shape.

The passage region 12 has an increasing width away from the entrance region 11; in more detail, the passage region 12 can have a continuously increasing width on moving away from the entrance region 11.

Figure 2:
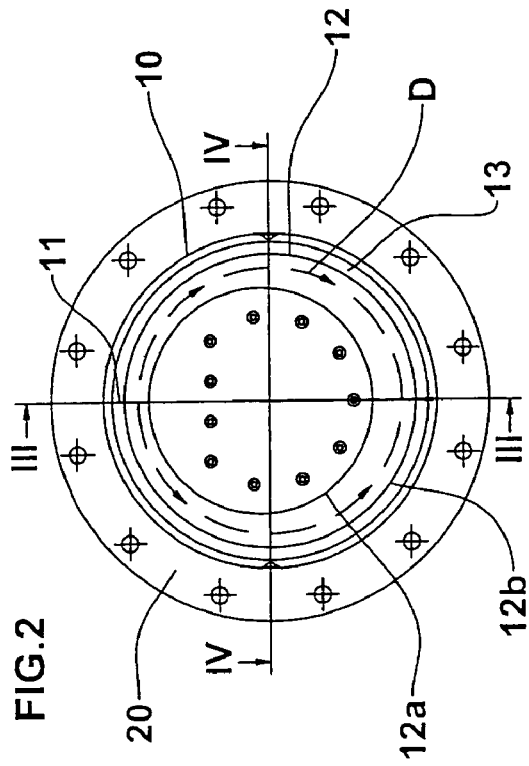
FIG. 2 is a diagrammatic sectioned top view taken along line II-II of the plasma generator shown in FIG. 1 with some parts removed for a better view of others.
Figure 4:
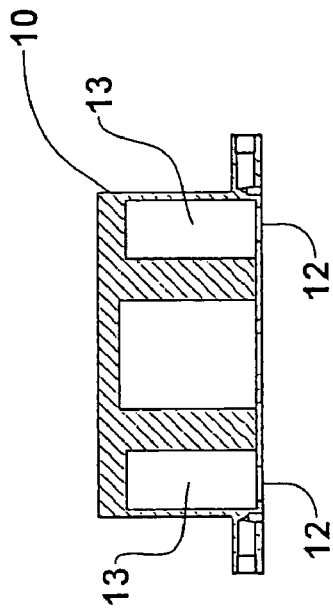
FIG. 4 is a diagrammatic section view taken along line IV-IV of the plasma generator seen in FIG. 2 with some parts removed for a better view of others.

The conformation of the passage region 12 can be defined, as shown by way of example in FIG. 2, by two circular outlines 12a, 12b that are not concentric with each other; the diameter of the inner outline 12a is smaller than the diameter of the outer outline 12b and, while the centre of the outer outline 12b is substantially coincident with the centre of the propagation chamber 10, the centre of the inner outline 12a is interposed between the centre of the outer outline 12b and the entrance region 11 (see the sectioned view in FIG. 2).

Alternatively, the conformation of the passage region 12 can have a logarithmic spiral extension.

It is to be noted that, in accordance with the Silvester's relation, the power (Ps) radiated from a slot is directly proportional to the square of the product of the electric field intensity (E) at the slot centre by the slot width (w):

$$Ps = k(E\,w)^2.$$

The compensation of the electric field intensity drop due to attenuation of the wave propagating along path 30 through progressive dissipation is ensured by the progressive increase of the slot width, i.e. of the passage region 12.

In particular, being α the attenuation, the electromagnetic field intensity E can be expressed as a function of the distance x (calculated along the median line of path 13) by the following relation:

$$E = E_0 \exp(-\alpha x).$$

Therefore, to keep power Ps constant it is necessary to satisfy, apart from multiplicative factors, the condition $$w = k \exp(\alpha x).$$

This exponential course can be ideally obtained through a logarithmic spiral defined by the relation $$\rho = R + w_0 e^{k\theta}$$

wherein R is the inner diameter of the slot (constant value), ρ is the polar co-ordinate of the outer side of the slot, θ is the angle included between 0 and π describing advancing along path 13, and $w_0$ is the starting width of the slot.

The outline of the passage region 12 can be approximately also defined by two circular non concentric outlines 12a, 12b as above stated.

The width increase of the passage region 12 is preferably in a transverse direction, and in particular it is substantially perpendicular to a major extension direction of path 13, i.e. the direction along which the electromagnetic radiation moves away from the entrance region 11 and propagates along the path 13 itself. This increase is practically found in a radial direction (FIG. 2).

Generally, the width increase of the passage region 12 away from the entrance region 11 aims at compensating for the attenuation to which the electromagnetic radiation is submitted during propagation along path 13; in this way, the uniformity of the obtained plasma toroid of the generating chamber 20 can be improved.

The passage region 12 therefore has a minimum width at the entrance region 11 of the electromagnetic radiation, and a maximum width at the diametrically opposite region.

Advantageously, generator 1 is provided with a plate-like element 14 separating the propagation chamber 10 from the generating chamber 20; therefore, the passage region 12 can be defined on the plate-like element 14.

In more detail the passage region 12 can be defined by a through opening obtained in the plate-like element 14 or by a portion of the element 14 itself made of a material pervious to passage of the electromagnetic radiation admitted into the propagation chamber 10.

Practically, the plate-like element 14 can define a lower surface of the propagation chamber 10 and of path 13.

It is to be noted that the electromagnetic radiation propagates in the propagation chamber 10, i.e. along path 13, in a transverse direction, preferably perpendicular to the direction followed by the radiation itself on passing from the propagation chamber 10 to the generating chamber 20.

In fact, when generator 1 is in a use condition, propagation along path 13 takes place substantially following a horizontal plane, while passage to the generating chamber takes place in a substantially vertical direction.

The generating chamber 20 is provided with a plurality of through holes 40 through which the gas to be ionised is introduced into the generating chamber 20 itself.

Preferably, admission of the gas to be ionised takes place following one or more transverse directions, in particular perpendicular to the propagation direction of the electromagnetic radiation in the generating chamber 20.

Each through hole 40 can have the same distance from the next adjacent through holes 40; the distance is calculated on the outer surface of the generating chamber 20 and, should the latter have a cylindrical conformation, this distance is defined by the arcs of the circumference joining the adjacent through holes 40.

Practically, the electromagnetic radiation propagates within the generating chamber in a substantially vertical direction, while the gas is inserted horizontally following radial directions from the outside to the inside of the generating chamber.

In this manner the plasma cloud obtained by interaction between the electromagnetic radiation and the gas to be ionised has a substantially toroidal conformation.

In order to supply the gas to be ionised to the inside of the generating chamber 20, generator 1 can comprise a tank (not shown) that is connected to said through holes 40 by suitable ducts.

The gases used can be argon (Ar), nitrogen ($N_2$), hydrogen ($H_2$), oxygen ($O_2$), methane ($CH_4$), silane ($SiH_4$), tetramethylsilane, chromium nitride, organometallic compounds, etc., for example.

In addition to the above, generator 1 can further be provided with filtering means 50 associated with the generating chamber 20; the filtering means 50 enables the plasma to come out of the generating chamber 20, while preventing escape of the electromagnetic radiation from the generating chamber 20 itself.

Preferably, the filtering means 50 is mounted at a lower end 20a of the generating chamber 20 and separates the last-mentioned chamber from a work chamber (not shown), in which the plasma is applied to predetermined materials for surface treatment of same.

Practically, the filtering means 50 may comprise a shielding grid provided with preferably hexagonal holes in particular with sizes of 5 mm from side to side, and a distance of 0.5 mm towards the adjacent hexagon, which grid is capable of ensuring a void/solid ratio higher than 80%.

The apparatus in which generator 1 is inserted applies to the field involving treatments by chemical vapour deposition through microwave-enhanced plasma (PECVD: Plasma-Enhanced Chemical Vapour Deposition).

Diagrammatically shown in FIG. 5 is the propagation chamber 10; it is possible to see the annular structure of path 13 and the passage region 12 defined by the inner outline 12a and outer outline 12b.

Figure 3:
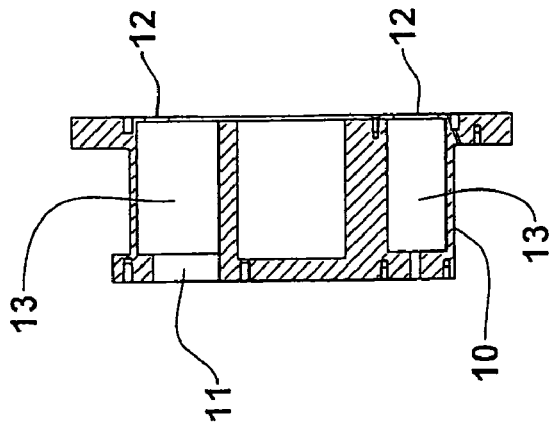
FIG. 3 is a diagrammatic sectioned view taken along line III-III of the plasma generator shown in FIG. 2 with some parts removed for a better view of others.

It will be noted that at the insertion region 11 path 13 has a larger width than that shown by the side branches of path 13; this feature is also highlighted in FIG. 3, where the portion of path 13 at the entrance region 11 has a larger width than the diametrically opposite portion.

Such a conformation enables an optimal coupling between the end portion of the waveguide 30 and the propagation chamber 10, in particular where the waveguide 30 has a rectangular cross section.

The invention achieves important advantages.

First of all, due to the above described conformation of the passage region 12 the spatial uniformity of the plasma cloud obtained in the generating chamber 200 can be optimised.

In addition, a high efficiency of the system is ensured even in the event of different types of plasma being generated in the generating chamber, since the suitably shaped passage region makes the system independent of the features of the ionised gas to be generated.

Another advantage is found in the fact that the generator in accordance with the invention is adapted to at least partly compensate for possible variations in the oscillation frequency of the electromagnetic-radiation generation, thus giving the system a convenient flexibility in use.

What is claimed is:

1. A plasma generator comprising:
   a plasma generating chamber for generating a plasma;
   a propagation chamber having an entrance region for receiving an electromagnetic radiation, and a passage region for outputting said electromagnetic radiation towards said plasma generating chamber;
   a plate-like separation element to separate said propagation chamber from said generating chamber;
   said propagation chamber comprising an annular path along which said electromagnetic radiation propagates
   said passage region being continuous along said annular path and having a defined length that increases in width from an upstream location close to the entrance region to a downstream location far from said entrance region, said passage region being defined in said plate-like element.

2. A generator as claimed in claim 1, wherein said passage region has a width increasing with continuity on moving away from said entrance region.

3. A generator as claimed in claim 1, wherein the conformation of said passage region is defined by two circular outlines that are not concentric with each other.

4. A generator as claimed in claim 1, wherein the conformation of said passage region has a logarithmic spiral course.

5. A generator as claimed in claim 1, wherein said passage region has an increasing width in a direction transverse to the direction away from the entrance region.

6. A generator as claimed in claim 1, wherein said passage region is defined by at least one opening in said plate-like element.

7. A generator as claimed in claim 1, wherein said passage region is defined by at least one portion of said plate-like element pervious to passage of said electromagnetic radiation.

8. A generator as claimed in claim 1, wherein said entrance region for insertion of the electromagnetic radiation is defined at a peripheral position of said propagation chamber.

9. A generator as claimed in claim 1, further comprising a waveguide connected to said propagation chamber for insertion of said electromagnetic radiation in a direction transverse to an equatorial plane of said path.

10. A generator as claimed in claim 1, wherein said generating chamber has a plurality of through holes to enable insertion of a gas to be ionised in said generating chamber.

11. A generator as claimed in claim 10, wherein said gas to be ionised is inserted in said generating chamber in one or more directions substantially transverse to a propagation direction of said electromagnetic radiation in said generating chamber.

12. A generator as claimed in claim 1, wherein a propagation direction of said electromagnetic radiation in said path is transverse to a propagation direction of said electromagnetic radiation through said passage region.

13. A generator as claimed in claim 1, further comprising filtering means associated with said generating chamber to enable the plasma generated by said electromagnetic radiation to come out of said generating chamber and to prevent escape of said electromagnetic radiation from said generating chamber.

14. An apparatus for surface treatment of materials, comprising a plasma generator as claimed in claim 1.

15. A plasma generator comprising:
- a propagation portion to propagate an electromagnetic radiation, said propagation portion having an entrance for receiving said electromagnetic radiation;
- a plasma generating portion for generating a plasma with said electromagnetic radiation
- a passage portion provided between said propagation portion and said generation portion, for allowing the electromagnetic radiation to enter the generating portion from the propagation portion
- a plate-like separation element to separate said propagation portion from said plasma generating portion;

said propagation portion comprising an annular path along which said electromagnetic radiation propagates wherein said passage portion is continuous along said annular path and has a window having an increasing width on moving away from said entrance, said window enabling at least partial passage of said electromagnetic radiation from said propagation portion towards said plasma generating portion, said window being defined in said plate-like separation element.

* * * * *